United States Patent
Kishishita

(10) Patent No.: US 7,525,198 B2
(45) Date of Patent: Apr. 28, 2009

(54) WIRING STRUCTURE OF A SEMICONDUCTOR DEVICE

(75) Inventor: Keisuke Kishishita, Kyoto (JP)

(73) Assignee: Panasonic Corporation, Osaka (JP)

( * ) Notice: Subject to any disclaimer, the term of this patent is extended or adjusted under 35 U.S.C. 154(b) by 153 days.

(21) Appl. No.: 11/219,716

(22) Filed: Sep. 7, 2005

(65) Prior Publication Data
US 2006/0131612 A1    Jun. 22, 2006

(30) Foreign Application Priority Data
Dec. 17, 2004   (JP)   ............... 2004-366609

(51) Int. Cl.
*H01L 23/528* (2006.01)
(52) U.S. Cl. .............. 257/758; 257/207; 257/211; 716/12
(58) Field of Classification Search ........... 257/207, 257/211, E21.614, E21.627, E21.641, 758, 257/E23.145; 716/12
See application file for complete search history.

(56) References Cited

U.S. PATENT DOCUMENTS

| 6,058,257 A * | 5/2000 | Nojima ............ 716/12 |
| 6,581,201 B2 * | 6/2003 | Cano et al. ............ 716/12 |
| 6,600,360 B2 * | 7/2003 | Mizuno et al. ............ 327/534 |

FOREIGN PATENT DOCUMENTS

JP     05-335484    12/1993

* cited by examiner

*Primary Examiner*—Anh Phung
*Assistant Examiner*—Michael Lulis
(74) *Attorney, Agent, or Firm*—McDermott Will & Emery LLP

(57) ABSTRACT

A mesh source wiring composed of first source wirings, second source wirings, and contacts for mesh source wiring is connected, through contacts for strap source wiring, with strap source wirings formed on a wiring layer nearer a substrate than wiring layers where the mesh source wiring is formed. The cell source wirings formed on a wiring layer nearer the substrate than the wiring layer where the strap source wirings are formed are connected with the strap source wirings through contacts for cell source wiring.

13 Claims, 9 Drawing Sheets

WIRING STRUCTURE OF A
SEMICONDUCTOR DEVICE

CROSS REFERENCE TO RELATED APPLICATIONS

This Non-provisional application claims priority under 35 U.S.C. § 119(a) on Patent Application No. 2004-366609 filed in Japan on Dec. 17, 2004, the entire contents of which are hereby incorporated by reference.

BACKGROUND OF THE INVENTION

The present invention relates to a semiconductor device having a plurality of wiring layers, and more specifically relates to a wiring structure of a semiconductor device.

Wiring resistance of a source wiring for supplying electric power to a circuit element in a semiconductor device must be set sufficiently small. Otherwise, severe voltage drop occurs when a current flows in the source wiring at initiation of the operation of the circuit element, inviting increase in operation delay and erroneous operation of the circuit element. In this connection, design of source wirings in semiconductor devices becomes a key in association with recent increase in scale and integration of semiconductor devices.

Especially, semiconductor devices that consume much power encounter remarkable voltage drop in the source wirings, and therefore, source wiring structures capable of stably supplying power to the circuit elements with less voltage drop are demanded.

In semiconductor devices having source wiring structures capable of stably supplying power, there is a device in which source wirings having widths corresponding to a total sum of power necessary for respective circuit elements on a semiconductor chip are arranged in mesh (for example, see Japanese Patent Application Laid Open Publication No. 5-335484A).

FIG. 8 is a plan view showing a source wiring structure of a conventional semiconductor device. Also, FIG. 9 is a view stereoscopically showing the positional relationship of each constitutional element shown in FIG. 8.

As shown in the drawings, the conventional semiconductor substrate 600 includes: a mesh source wiring 610, which is composed of first source wirings 620 formed on a wiring layer, second source wirings 630 formed on another wiring layer, and contacts 640 for mesh source wiring; cell source wirings 650 formed on a layer lower than the layers where the mesh source wiring 610 is formed; contacts 660 for cell source wiring; and circuit elements 670.

The widths and the numbers of the first source wirings 620 and the second source wirings 630 correspond to a total sum of power necessary for the circuit elements 670.

The contacts 640 for mesh source wiring connect the first source wirings 620 and the second source wirings 630.

The contacts 660 for cell source wiring connect the second source wirings 630 and the cell source wirings 650 with each other.

In the semiconductor device thus structured, when the mesh source wiring 610 is connected to a power source (or grounded) by means of a power supply terminal (not shown), the power is supplied stably to the circuit elements 670 through the contacts 660 for cell source wiring and the cell source wirings 650.

However, the above conventional semiconductor device involves the following problems.

In general, the mesh source wiring 610 occupies the uppermost wiring layer and the wiring layer just below it while the cell source wirings 650 lie on the lowermost wiring layer. Accordingly, a plurality of wiring layers lie between the wiring layer where the second source wirings 630 are formed and the wiring layer where the cell source wirings 650 are formed.

In this connection, for connecting parts where the mesh source wiring 610 and the cell source wirings 650 intersect with each other, it is necessary to form many contacts 660 for cell source wiring which pass through a plurality of wiring layers. Namely, the contacts 660 for cell source wiring consume wiring resources (region required for wiring) in a plurality of wiring layers, which in turn inhibits efficient wiring of singal wirings.

Particularly, in association with increase in number of wiring layers for high integration of semiconductor devices, the number of wiring layers between the mesh source wiring 610 and the cell source wirings 650 increases, so that the influence that the contacts 660 for cell source wiring consume the wiring resources grows severely.

Further, in association with miniaturization of wirings in progress of semiconductor device manufacturing technology, wiring resistance per unit length increases. However, mere widening the wiring width of the mesh source wiring 610 and the cell source wirings 650 in the generation of, for example, about 0.13 µm process attains insufficient lowering of the wiring resistance of the source wirings. In this way, it is difficult to suppress voltage drop of the source voltage to be supplied to the circuit elements 670.

In miniaturized wirings, the upper limit of the wiring width is restricted for increasing a manufacturing yield, so that voltage drop of the source voltage is difficult to be sufficiently suppressed even if the widths of all source wirings are set large as far as possible.

The upper two wiring layers that the mesh source wiring 610 occupies generally have wiring resistances per unit length lower than the other wiring layers, and therefore, it is useful for arranging signal wirings having high frequencies. While, as the wiring intervals of the mesh source wiring 610 becomes narrower for lowering the wiring resistance of the source wirings, the wiring resources for signal wiring in the upper two wiring layers are consumed more. In consequence, the signal wirings having high frequencies have to be formed on other wiring layers. This degrades the timing of the signal wirings and necessitates increase in area of the semiconductor device for supplementing the short of the wiring resources.

Furthermore, the timing degradation involves many design steps for countermeasures thereto, inviting increase in design period. Also, the increase in area of the semiconductor device invites voltage drop of the source voltage caused due to increase in lengthy routed source wirings and increases in manufacturing cost because of a lowered yield of the semiconductor device.

SUMMARY OF THE INVENTION

The present invention has been made in view of the above problems and has its object of providing a highly-integrated semiconductor device by ensuring much wiring resources for singal wiring while maintaining stable operation of the semiconductor device by suppressing voltage drop of source voltage.

To attain the above object, the present invention provides a semiconductor device having a substrate and a plurality of wiring layers including first, second, third, and fourth wiring layers, including:

a plurality of first source wirings formed in parallel with each other on the first wiring layer;

a plurality of second source wirings formed in a direction intersecting at a right angle with the first source wirings on the second wiring layer, the second wiring layer being located nearer the substrate than the first wiring layer;

a plurality of third source wirings formed on the third wiring layer, the third wiring layer being located nearer the substrate than the second wiring layer;

a plurality of fourth source wirings formed on the fourth wiring layer, the fourth wiring layer being located nearer the substrate than the third wiring layer;

a first contact that connects one of the first source wirings and one of the second source wirings with each other at a part where the first source wiring and the second source wiring intersect with each other;

a second contact that connects one of the third source wirings and at least one of the first source wirings and the second source wirings with each other; and a third contact that connect one of the third source wirings and one of the fourth source wirings with each other.

With the above structure, the number of contacts passing through wiring layers between the first wiring layer and the third wiring layer is reduced, ensuring more wiring resources (region required for wiring) for signal wiring, compared with conventional semiconductor deceives, and enabling higher integration of the semiconductor device. Further, the provision of the third source wirings can increase the number of wirings to be used for power supply, resulting in lowered wiring resistance of the source wirings.

In another aspect of the present invention, in the above semiconductor device, at least one of the third source wirings intersects with the second source wirings or is overlaid in parallel with corresponding one of the second source wirings.

In still another aspect of the present invention, in the above semiconductor, the third source wirings are overlaid in parallel with the second source wirings, respectively.

With the above structures, the second source wirings and the third source wirings can be connected with each other through the contact directly, so that the number of contacts in the second wiring layer and in a wiring layer between the first wiring layer and the second wiring layer can be reduced, ensuring much wiring resources for signal wiring.

In a different aspect of the present invention, in the above semiconductor device, the second contact is formed at at least one of parts where the first source wirings and the third source wirings intersect with each other and parts where the second source wirings and the third source wirings intersect with each other.

In the above structure, the second contact is formed at at least one of parts where the first source wirings and the third source wirings intersect with each other and parts where the second source wirings and the third source wirings intersect with each other, ensuring further more wiring resources for signal wiring.

In a still different aspect of the present invention, in the above semiconductor device, the first wiring layer is provided the farthest from the substrate.

In the above structure, the first source wirings are formed on the wiring layer farthest from the substrate. Hence, further more wiring resources for signal wiring can be ensured in wiring layers between the first wiring layer and the third wiring layer.

In another aspect of the present invention, in the above semiconductor device, respective wiring widths and respective wiring intervals of the first source wirings, the second source wirings, and the third source wirings are set so that an amount of voltage drop of source voltage in an circuit element to which source power is supplied becomes a predetermined value or smaller.

With the above structure, appropriate source voltage is supplied to the circuit elements in the semiconductor device.

In still another aspect of the present invention, in the above semiconductor device, signal wirings are formed in the first wiring layer, the second wiring layer, and the third wiring layer.

In a different aspect of the present invention, in the above semiconductor device, the first source wirings, the second source wirings, and the third source wirings are overlaid with a circuit element on a plane projected to the substrate.

With the above structures, the wiring resources of the first wiring layer, the second wiring layer, and the third wiring layer can be utilized effectively for signal wiring beside the wiring resources for source wiring.

In a further different aspect of the present invention, in the above semiconductor device, wherein the fourth source wirings intersect at a right angle with the third source wirings.

In the above structure, the fourth source wirings intersect at right angle with the third source wirings, so that connection between the third source wirings and the fourth source wirings by means of the third contact is facilitated.

In another aspect of the present invention, in the semiconductor device, the third contact is formed at at least one of parts where the third source wirings and the fourth source wirings intersect with each other.

In the above structure, the third contact is formed at at least one of the intersections where the third source wirings and the fourth source wirings intersect with each other, ensuring more wiring resources for signal wiring.

DETAILED DESCRIPTION OF THE PREFERRED EMBODIMENTS

Embodiments of the present invention will be described below with reference to the accompanying drawings.

Embodiment 1

Figure 1:
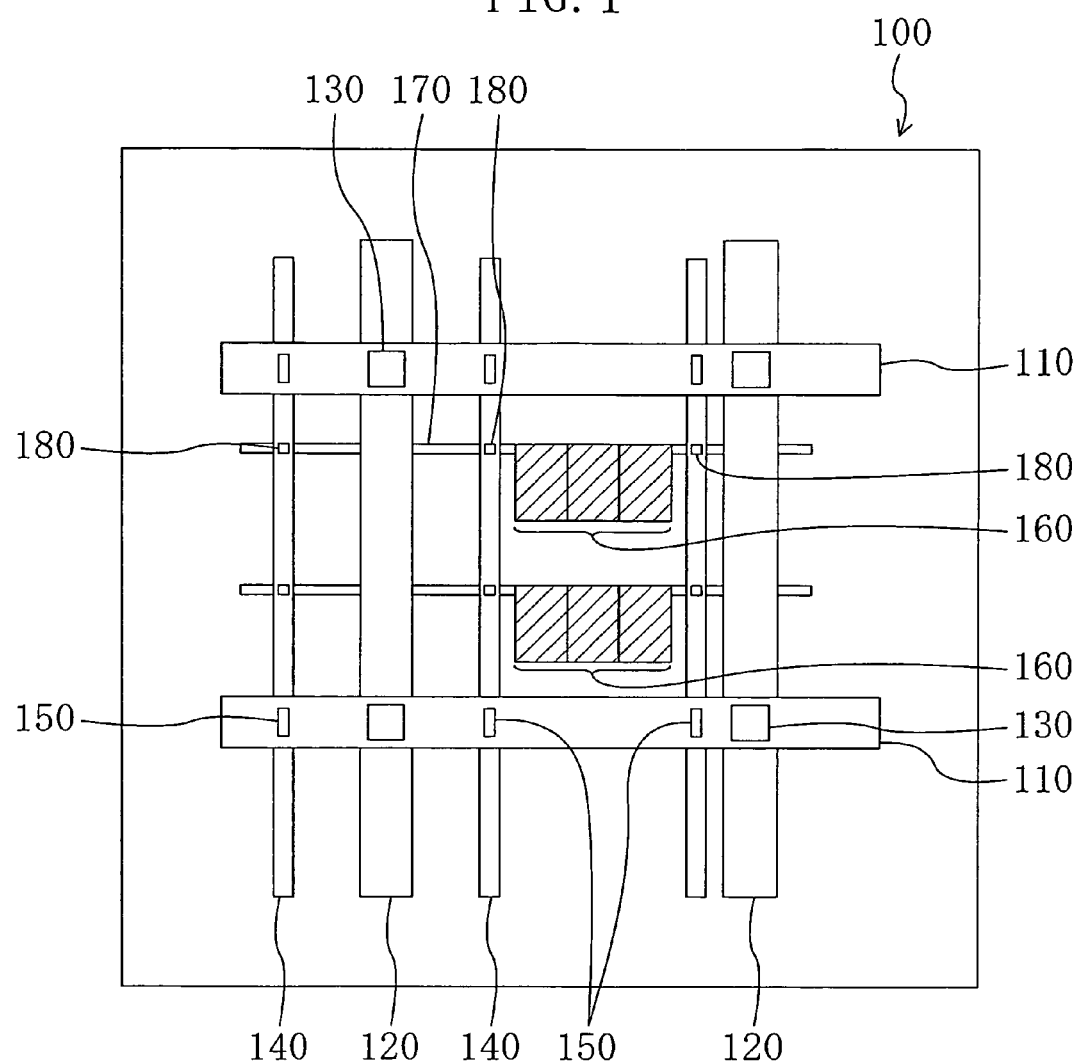
FIG. 1 is a plan view showing a construction of a semiconductor device according to Embodiment 1 of the present invention.

FIG. 1 is a plan view showing a construction of a semiconductor device 100 according to Embodiment 1 of the present invention.

The semiconductor device 100 has a plurality of wiring layers and includes, as shown in the drawing: a mesh-like source wiring (mesh source wiring) compose of a plurality of first source wirings 110, a plurality of second source wirings 120, and a plurality of contacts 130 for mesh source wiring; a plurality of strap source wirings 140; a plurality of contacts 150 for strap source wiring; a plurality of standard cells 160; a plurality of cell source wirings 170; and a plurality of contacts 180 for cell source wiring.

Figure 2:
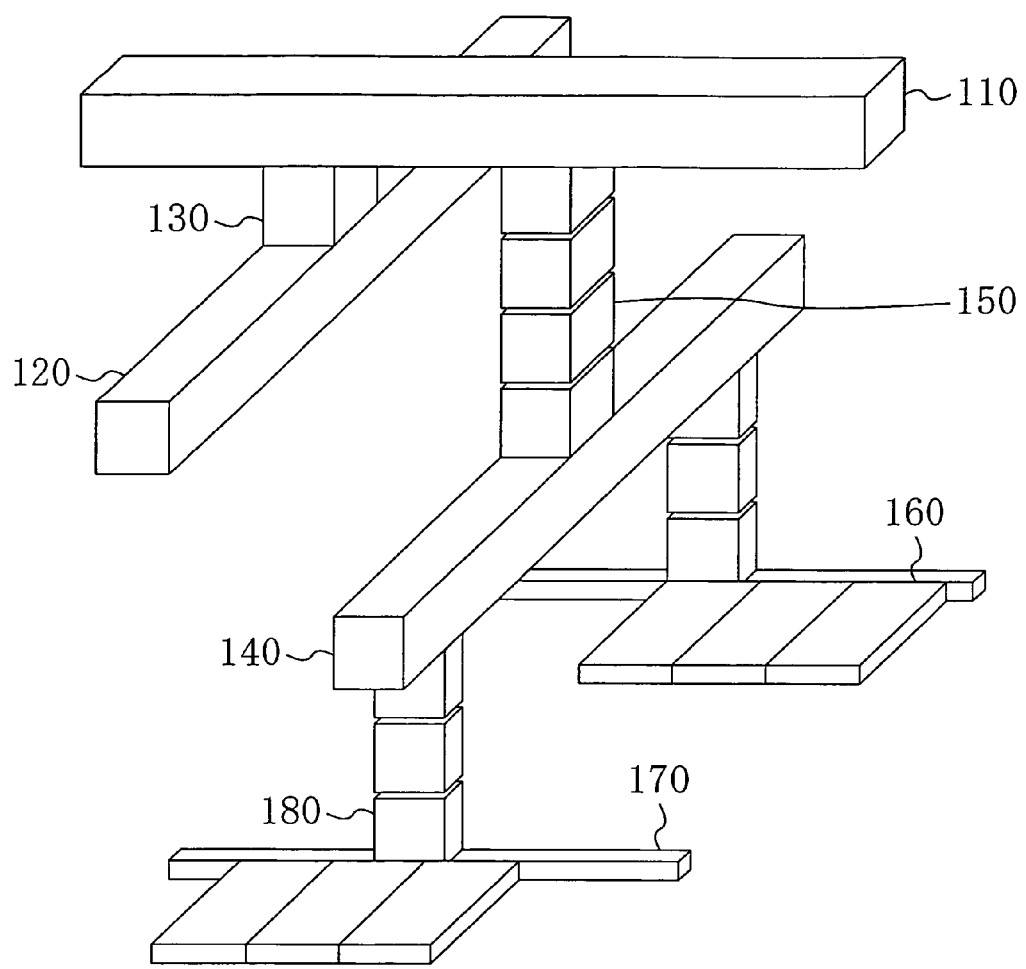
FIG. 2 is a view stereoscopically showing the positional relationship of source wirings and the like in the semiconductor device according to Embodiment 1 of the present invention.

FIG. 2 is a drawing stereoscopically showing the positional relationship between the first source wirings 110 and the like. Wherein, in the following description, the wiring layer where the first source wirings 110 are formed is located on the upper side for the convenience sake.

The first source wirings 110 are formed, for example, on the uppermost layer of the semiconductor device in parallel to each other at a predetermined intervals and are connected to a power source (or grounded) by means of a source supply terminal (not shown).

The second source wirings 120 are formed on a wiring layer lower than the wiring layer where the first source wirings 110 are formed in a direction intersecting at a right angle with the first source wirings 110 on a projected plane when viewed from the uppermost layer side. The second source wirings 120 are arranged in parallel with each other at predetermined intervals.

The wiring widths and the wiring intervals of the first source wirings 110 and the second wirings 120 are determined according to power consumption of circuit elements such as the standard cells 160 and the like to which source power is supplied.

The contacts 130 for mesh source wiring are formed, as shown in FIG. 1 and FIG. 2, at parts where the first source wirings 110 and the second source wirings 120 intersect with each other so as to connect the first source wirings 110 and the second source wirings 120 with each other.

The mesh source wiring may be used as a VDD wiring for supplying source power at high potential to the standard cells 160 or as a VSS wiring for supplying source power at low potential to the standard cells 160.

The strap source wirings 140 are arranged in parallel with each other in the same direction as that of the second source wirings 120 on a wiring layer between the wiring layer where the second source wirings 120 are formed and the wiring layer where the standard cells 160 are provided, for example, in a wiring layer one layer upper than the wiring layer where the standard cells 160 are provided. The wiring width and the wiring intervals of the strap source wirings 140 are determined according to power consumption of circuit elements such as the standard cells 160 and the like to which source power is supplied.

The contacts 150 for strap source wiring are formed at parts where the first source wirings 110 and the strap source wirings 140 intersect with each other so as to connect the first source wirings 110 and the strap source wirings 140.

The standard cells 160 are circuits operated at the source voltage (or ground voltage) supplied from the cell source wirings 170.

The cell source wirings 170 are formed correspondingly to the positions of the standard cells 160 in the layer where the standard cells 160 are provided so as to supply the source power (or ground voltage) to the respective standard cells 160.

The contacts 180 for cell source wiring connect the strap source wirings 140 and the cell source wirings 170 with each other at parts where they intersect with each other.

Though not shown in FIG. 1 and the like, signal wirings are formed in addition on the wiring layers where the first source wirings 110, the second source wirings 120, the strap source wirings 140, and the like are formed. Further, though not shown in FIG. 2, at least one wiring layer is interposed between the wiring layer where the second source wirings 120 are formed and the wiring layer where the strap source wirings 140 are formed in the semiconductor device 100.

In the semiconductor device 100 structured as above, the cell source wirings 170 are arranged at intervals corresponding to the positions of the standard cells 160 while the wiring intervals of the first source wirings 110, the second source wirings 120, and the strap source wirings 140 can be set wider than those of the cell source wirings 170. Hence, the number of the contacts 150 for strap source wiring can be reduced to the number smaller than the number of the contacts 180 for cell source wiring (that is, the number approximately corresponding to the number of the contacts 660 for cell source wiring in the conventional semiconductor devices).

Specifically, the provision of the strap source wirings 140 enables increase in wiring resources (region required for wiring) for signal wiring in the wiring layers between the wiring layer where the first source wirings 110 are formed and the wiring layer where the strap source wirings 140 are formed, compared with the conventional semiconductor devices. This increase in wiring resources by the reduction of the contacts becomes larger as the number of the wiring layers located between the wiring layer where the second source wirings 120 are formed and the wiring layer where the strap source wirings 140 are formed increases and as the number of the wiring layers located between the wiring layer where the strap source wirings 140 are formed and the wiring layer where the cell source wirings 170 are formed decreases.

The source power (or ground voltage) is supplied to the standard cells 160 through the first source wirings 110, the contacts 150 for strap source wiring, the strap source wirings 140, the contacts 180 for cell source wiring, and the cell source wirings 170 in this order. The provision of the strap source wiring 140 enables increase in number of the wirings used for power supply, lowering the wiring resistances of the source wirings. In other words, voltage drop, which is caused due to insufficient power supply only from the first source wirings 110 and the second source wirings 120, can be mitigated, operating the semiconductor device stably.

Further, though the upper two wiring layers of the semiconductor device have wiring resistance per unit length lower than those of the other wiring layers, and therefore, have an advantage in arranging, for example, signal wirings having high frequencies, such signal wirings could not have been formed on the upper wiring layers. However, the number of contacts are reduced by providing the strap source wirings as described above, so that the wiring resources that the mesh source wiring consumes in the upper two wiring layers of the semiconductor device can be reduced, enabling formation of the signal wirings having high frequencies in the upper wiring layers.

Embodiment 2

An example is described in which the number of contacts for power supply is further reduced while the wiring resources are increased compared with Embodiment 1.

Wherein, in the following embodiments, the same reference numerals are assigned to the constitutional elements having the same functions as in Embodiment 1 and the description thereof is omitted.

Figure 3:
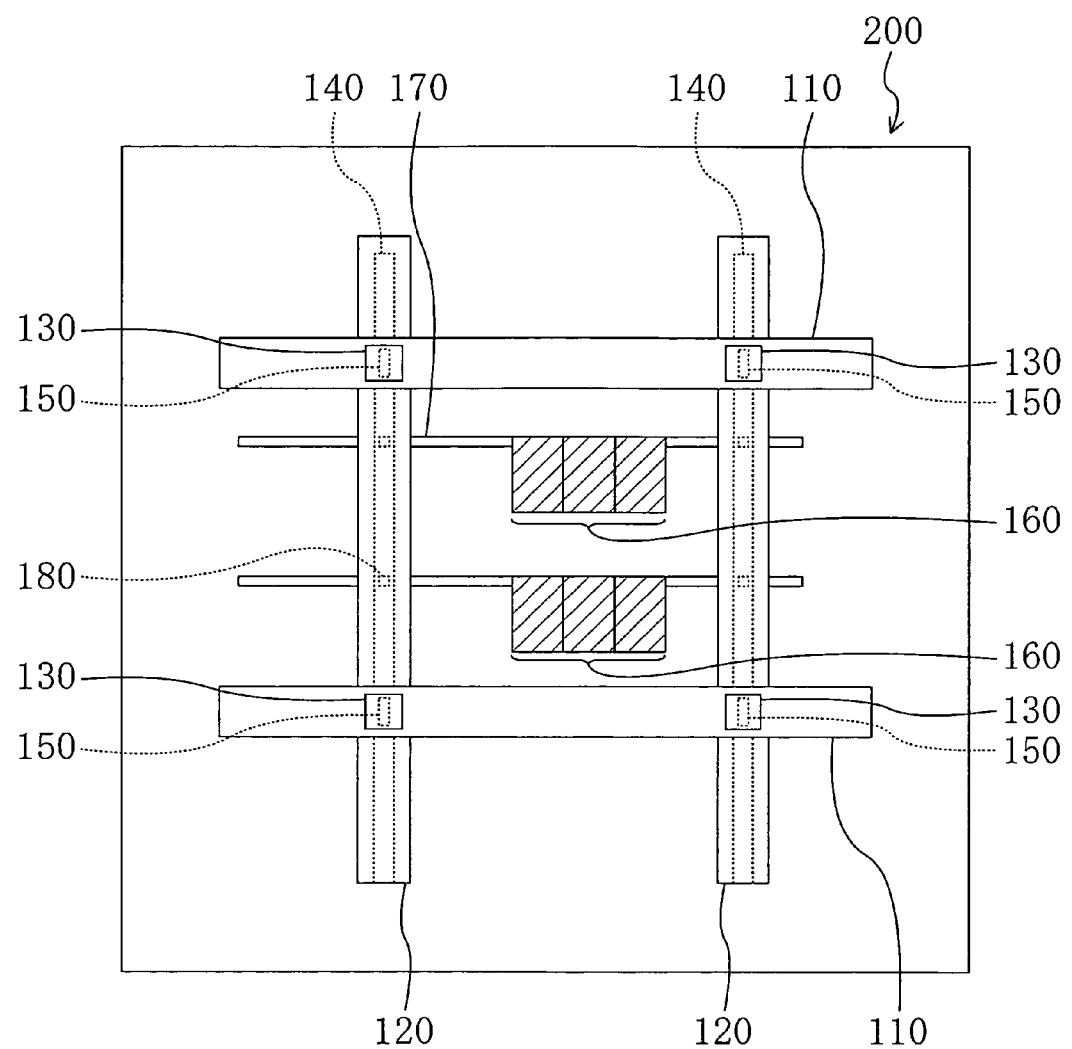
FIG. 3 is a plan view showing a construction of a semiconductor device according to Embodiment 2 of the present invention.
Figure 4:
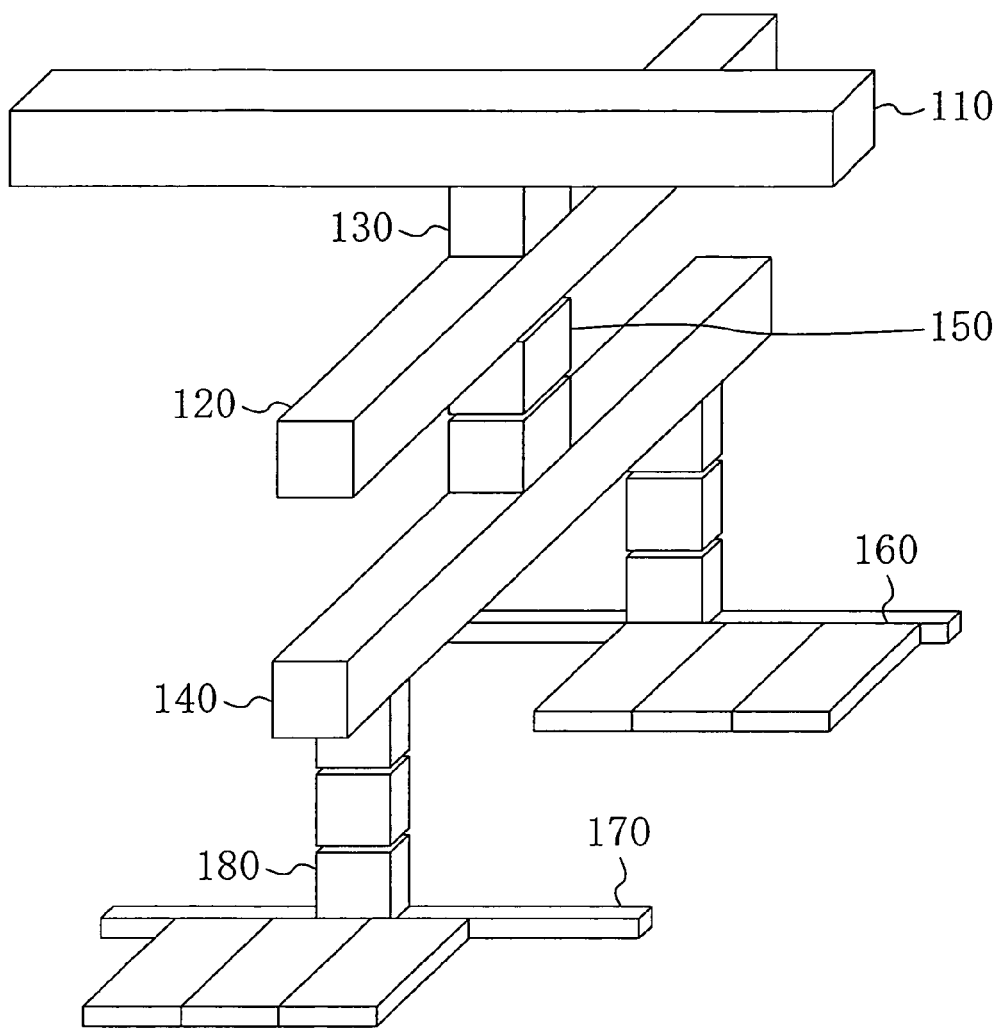
FIG. 4 is a view stereoscopically showing the positional relationship of source wirings and the like in the semiconductor device according to Embodiment 2 of the present invention.

FIG. 3 is a plan view showing a construction of a semiconductor device 200 according to Embodiment 2 of the present invention. FIG. 4 is a view stereoscopically showing the positional relationship of each constitutional element of the semiconductor device 200.

The semiconductor 200 is different from the semiconductor device in Embodiment 1, as shown in FIG. 3 and FIG. 4, in that the second source wirings 120 and the strap source wirings 140 are overlaid with each other when viewed from the wiring layer where the first source wirings 110 are formed and in that the contacts 130 for mesh source wiring and the contacts 150 for strap source wiring are formed at parts where the first source wirings 110 and the second source wirings 120 intersect with each other.

When all of the strap source wirings 140 are arranged in parallel with and overlaid with the respective second source wirings 120, as described above, the contacts 130 for mesh source wiring and the contacts 150 for strap source wiring can be formed in the same points when viewed from above. In other words, contacts passing through the first source wiring 110 through to the strap source wiring 140 via the second source wiring 120 can be formed.

Hence, the number of the contacts passing through a plurality of wiring layers between the wiring layer where the first source wirings 110 are formed and the wiring layer where the second source wirings 120 are formed can be reduced while the wiring resources for signal wiring increases further, compared with the device in Embodiment 1.

Embodiment 3

Figure 5:
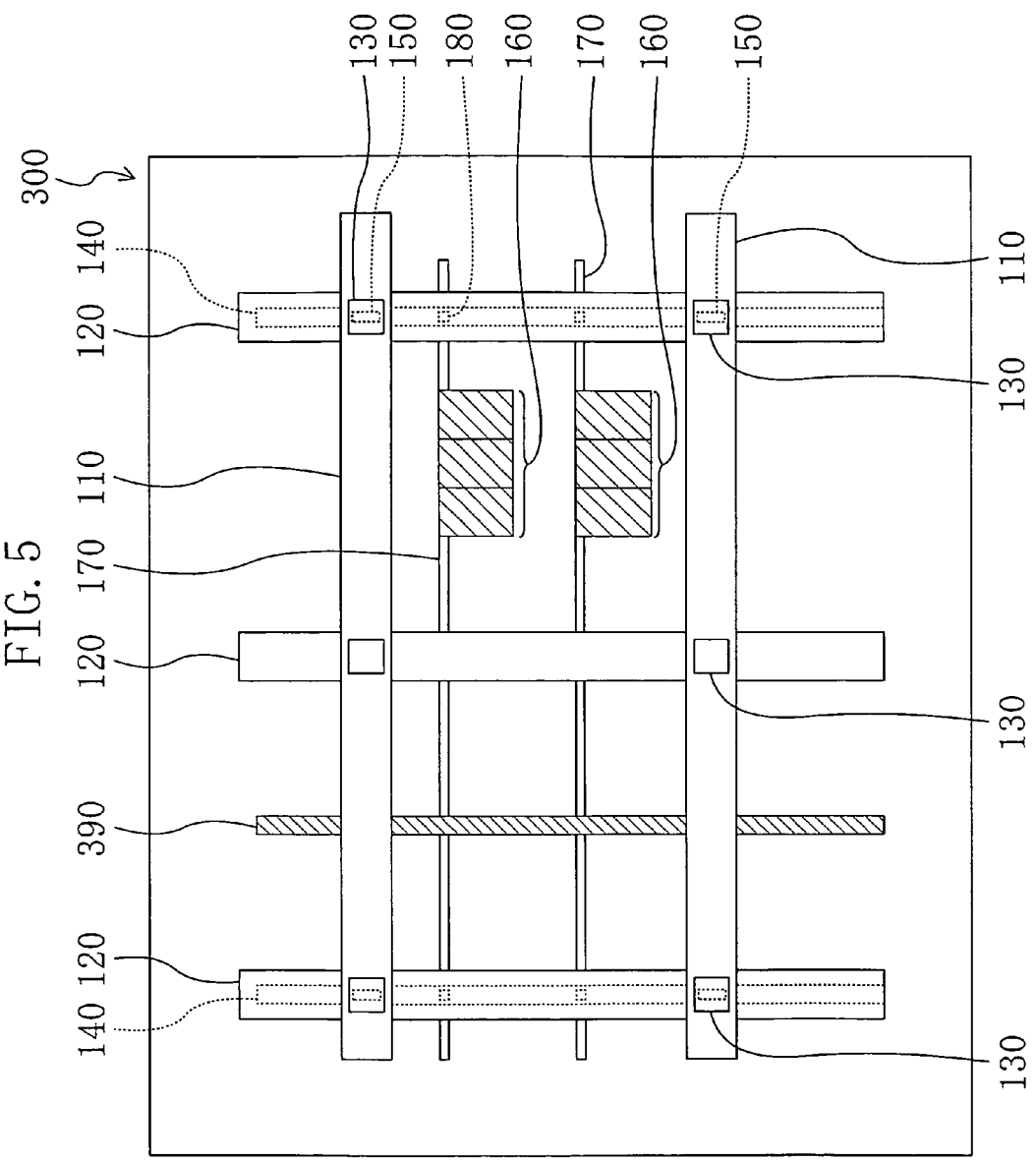
FIG. 5 is a plan view showing a construction of a semiconductor device according to Embodiment 3 of the present invention.

FIG. 5 is a plan view showing a construction of a semiconductor device 300 according to Embodiment 3 of the present invention.

In the semiconductor device 300, the strap source wirings 140 are formed so as to correspond to some of the second source wirings 120, different from the semiconductor device of Embodiment 2 in which the strap source wirings 140 are formed in one-to-one correspondence to the second source wirings 120. The number of the strap source wirings 140 formed is determined so that the value of voltage drop of the source voltage falls within a tolerable range.

With the above arrangement, the numbers of the contacts 150 for strap source wiring and the contacts 180 for cell source wiring can be further reduced compared with each of the above embodiments.

In addition, when the number of the strap source wirings 140 is determined as above, the number of the strap source wirings 140 can be reduced, increasing the wiring resources for a signal wiring 390 (in FIG. 5) formed on the wiring layer where the strap source wirings 140 are formed.

Embodiment 4

Figure 6:
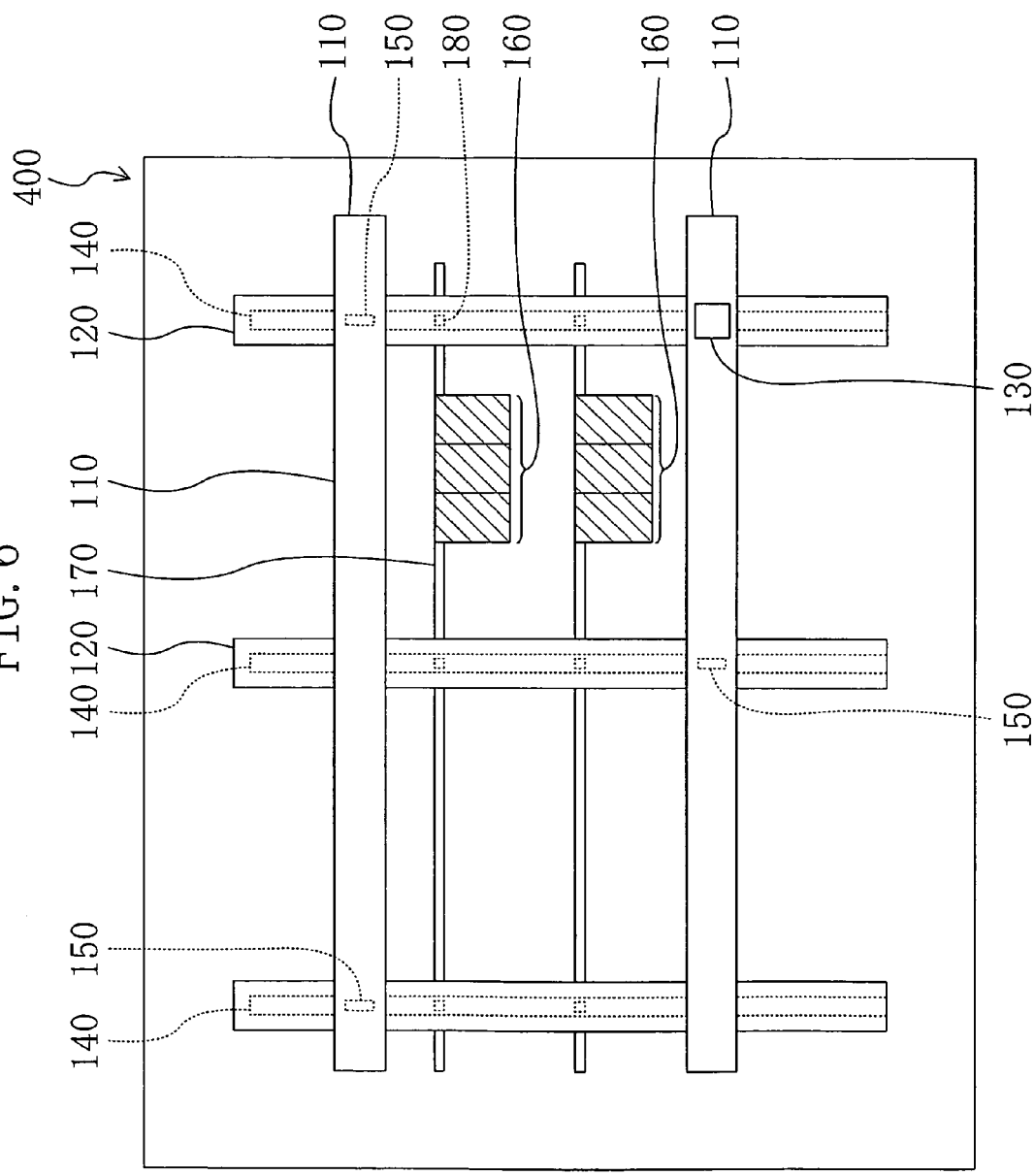
FIG. 6 is a plan view showing a construction of a semiconductor device according to Embodiment 4 of the present invention.

FIG. 6 is a plan view showing a construction of a semiconductor device 400 according to Embodiment 4 of the present invention.

In the semiconductor device 400, the contacts 150 for strap source wiring are formed at some of the parts where the first source wirings 110 and the strap source wirings 140 intersect with each other, different from Embodiment 1 and the like in which the contacts 150 for strap source wiring are formed in one-to-one correspondence to all the parts where the first source wirings 110 and the strap source wirings 140 intersect with each other.

In the semiconductor device 400, the number of the contacts 150 for strap source wiring formed is determined so that the value of voltage drop of the source voltage falls within a tolerable range.

It is noted that only one contact 130 for mesh source wiring is indicated in FIG. 6 but it may be provided at each of the parts where the first source wirings 110 and the second source wirings 120 intersect with each other.

As described above, the contacts 150 for strap source wiring are arranged at some of the intersections, so that the wiring resources for signal wiring in the wiring layers upper than the wiring layer where the strap source wirings 140 are formed can be increased. This increase in wiring resources becomes larger as the number of the wiring layers between the wiring layer where the second source wirings 120 are formed and the wiring layer where the strap source wirings 140 are formed is larger.

Embodiment 5

Figure 7:
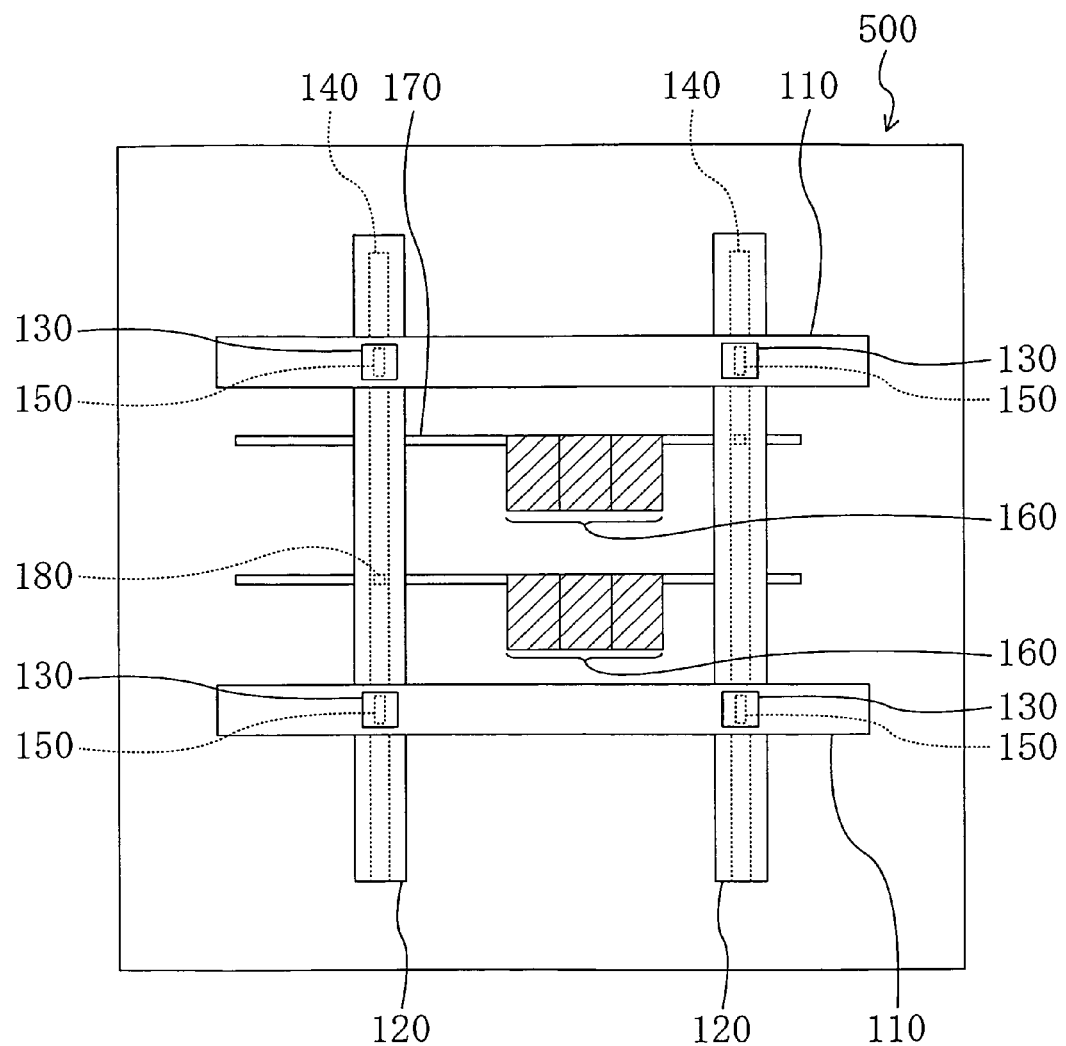
FIG. 7 is a plan view showing a construction of a semiconductor device according to Embodiment 5 of the present invention.
Figure 8:
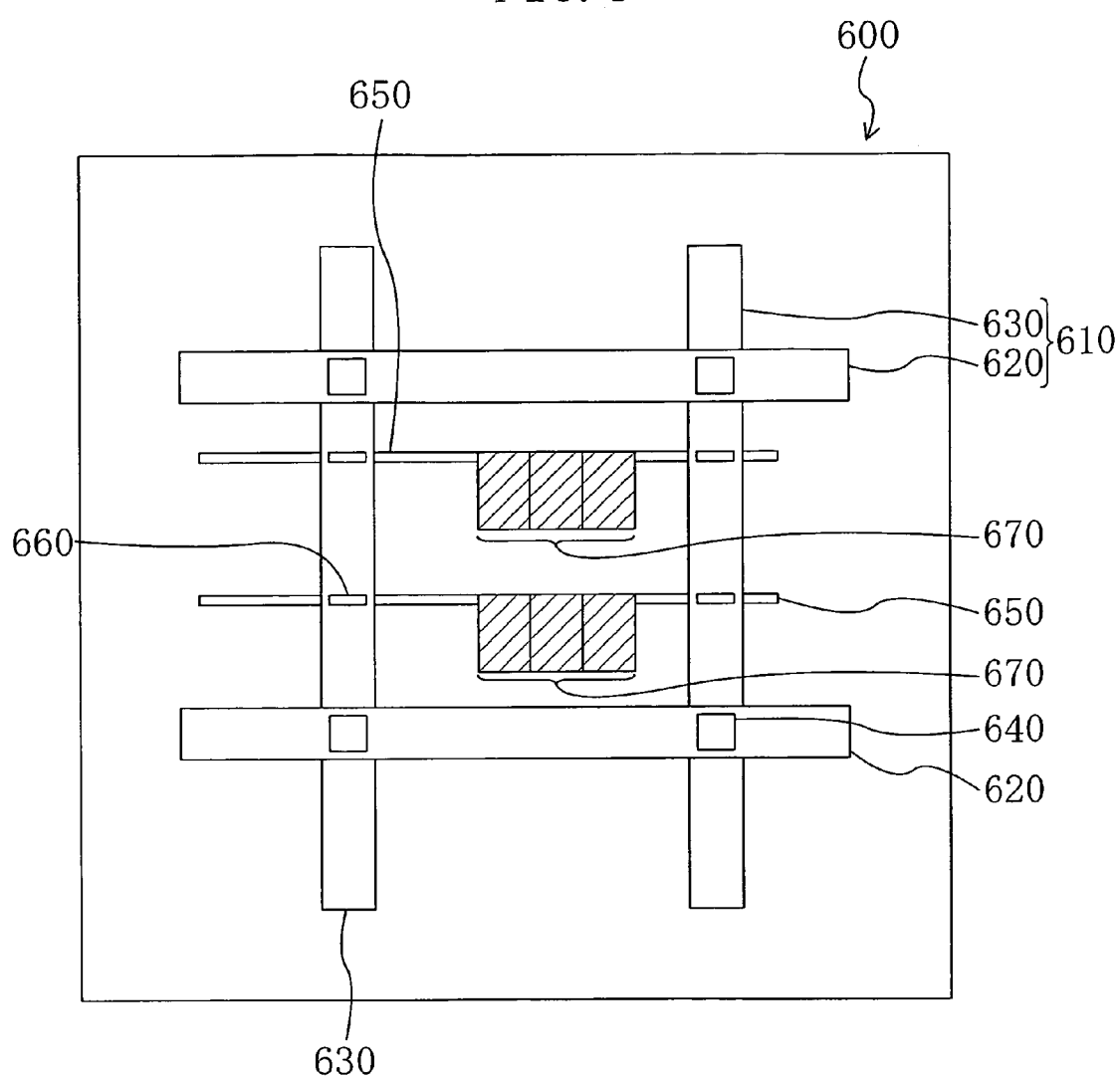
FIG. 8 is a plan view showing a construction of a conventional semiconductor device.
Figure 9:
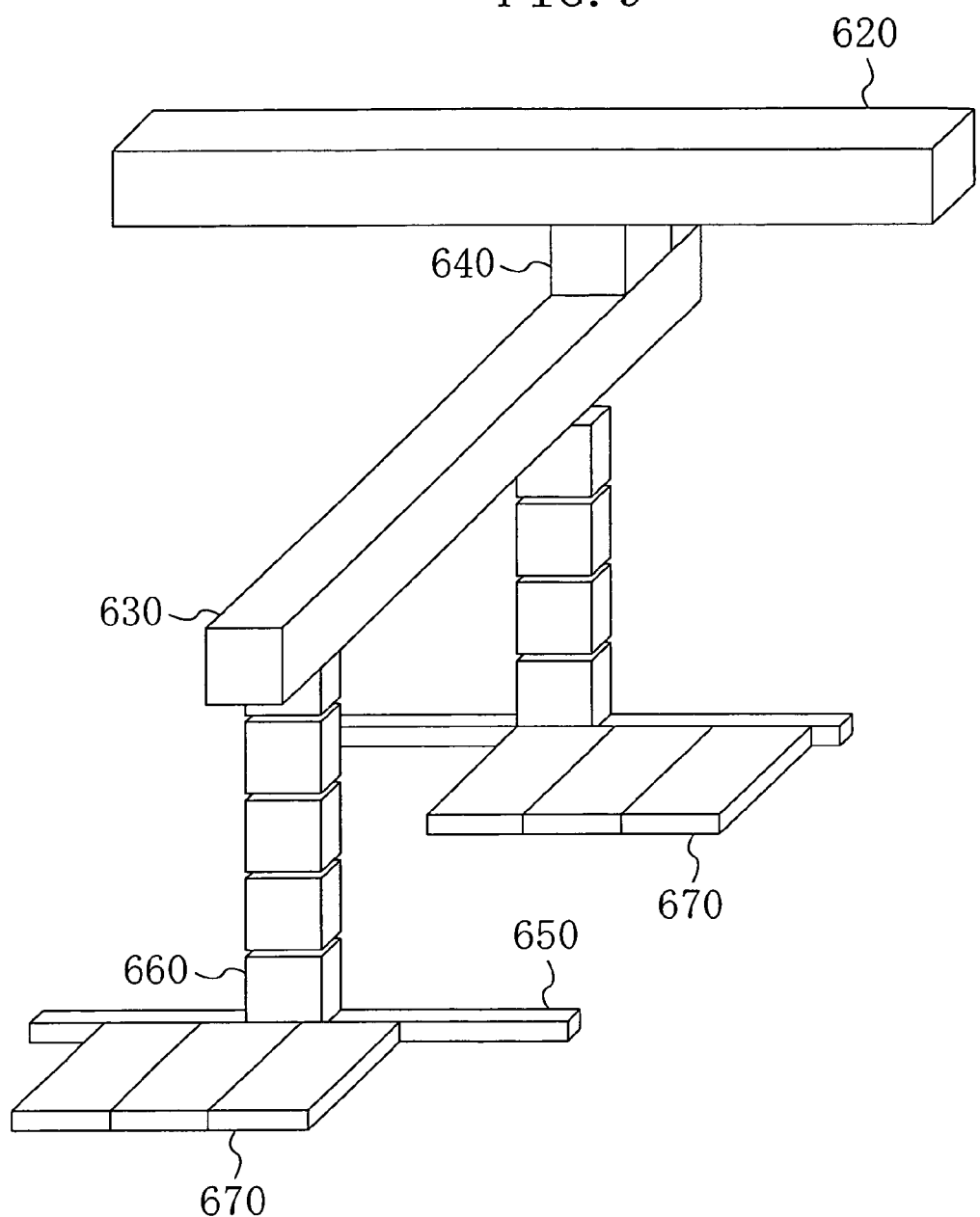
FIG. 9 is a view stereoscopically showing the positional relationship of source wirings and the like in the conventional semiconductor device.

FIG. 7 is a plan view showing a construction of a semiconductor device 500 according to Embodiment 5 of the present invention.

In the semiconductor device 500, the contacts 180 for cell source wiring are formed at some of the parts where the strap source wirings 140 and the cell source wirings 170 intersect with each other, different from the device in Embodiment 2 in which the contacts 180 for cell source wiring are formed at all of the parts where the strap source wirings 140 and the cell source wirings 170 intersect with each other. The number of the contacts 180 for cell source wiring formed is determined so that the value of voltage drop of the source voltage falls within a tolerable range.

Hence, in the present embodiment, the wiring resources for signal wiring in the wiring layer located between the wiring layer where the strap source wirings 140 are formed and the wiring layer where the cell source wirings 170 are formed can be increased.

It is noted that the respective wiring layers where the first source wirings 110, the second source wiring 120, and the strap source wirings 140 are formed may be used as wiring layers for signal wiring in each embodiment.

Further, the first source wirings 110, the second source wirings 120, and the strap source wirings 140 may be arranged so as to overlap with a circuit element such as a transistor on a plane projected to the substrate.

Moreover, the strap source wirings 140 may intersect with the second source wirings 120 on a plane projected to the substrate, rather than the parallel arrangement therewith.

As described above, the semiconductor device according to the present invention exhibits effects that voltage drop of the source voltage is suppressed, stable operation of the semiconductor device is maintained, and the wiring resources for signal wiring can be ensured more, and is useful as a semiconductor device having a plurality of wiring layers.

What is claimed is:

1. A semiconductor device having a substrate and a plurality of wiring layers including first, second, third, and fourth wiring layers, comprising:
   a plurality of first source wirings formed in parallel with each other on the first wiring layer;
   a plurality of second source wirings formed in a direction intersecting at a right angle with the first source wirings on the second wiring layer, the second wiring layer being located nearer the substrate than the first wiring layer;
   a plurality of third source wirings formed on the third wiring layer, the third layer being located nearer the substrate than the second wiring layer;
   a plurality of fourth source wirings formed on the fourth wiring layer, the fourth wiring layer being located nearer the substrate than the third wiring layer;
   a first contact that connects one of the first source wirings and one of the second source wirings with each other at a part where the first source wiring and the second source wiring intersect with each other;
   a second contact that connects one of the third source wirings and at least one of the first source wirings and the second source wirings with each other; and
   a third contact that connects one of the third source wirings and one of the fourth source wirings with each other;
   wherein the number of second contacts is less than the number of third contacts, and
   a plurality of signal wiring layers are included between the second wiring layer and the third wiring layer, and a plurality of signal wiring layers are included between the third wiring layer and the fourth wiring layer.

2. The semiconductor device of claim 1,
   wherein at least one of the third source wirings intersects with the second source wirings or is overlaid in parallel with corresponding one of the second source wirings.

3. The semiconductor device of claim 2,
   wherein the third source wirings are overlaid in parallel with the second source wirings, respectively.

4. The semiconductor device of claim 3,
   wherein the second contact is formed at at least one of parts where the first source wirings and the third source wirings intersect with each other and parts where the second source wirings and the third source wirings intersect with each other.

5. The semiconductor device of claim 2,
   wherein the second contact is formed at at least one of parts where the first source wirings and the third source wirings intersect with each other and parts where the second source wirings and the third source wirings intersect with each other.

6. The semiconductor device of claim 1,
   wherein the second contact is formed at at least one of parts where the first source wirings and the third source wirings intersect with each other and parts where the second source wirings and the third source wirings intersect with each other.

7. The semiconductor device of claim 1,
   wherein the first wiring layer is provided the farthest from the substrate.

8. The semiconductor device of claim 1,
   wherein respective wiring widths and respective wiring intervals of the first source wirings, the second source wirings, and the third source wirings are set so that an amount of voltage drop of source voltage in an circuit element to which source power is supplied becomes a predetermined value or smaller.

9. The semiconductor device of claim 1,
   wherein signal wirings are formed in the first wiring layer, the second wiring layer, and the third wiring layer.

10. The semiconductor device of claim 1,
    wherein the first source wirings, the second source wirings, and the third source wirings are overlaid with a circuit element on a plane projected to the substrate.

11. The semiconductor device of claim 1,
    wherein the fourth source wirings intersect at a right angle with to the third source wirings.

12. The semiconductor device of claim 11,
    wherein the third contact is formed at at least one of parts where the third source wirings and the fourth source wirings intersect with each other.

13. A semiconductor device having a substrate and a plurality of wiring layers including first, second, third, and fourth wiring layers, comprising:
    a plurality of first source wirings formed in parallel with each other on the first wiring layer;
    a plurality of second source wirings formed in a direction intersecting at a right angle with the first source wirings on the second wiring layer, the second wiring layer being located nearer the substrate than the first wiring layer;
    a plurality of third source wirings formed on the third wiring layer, the third layer being located nearer the substrate than the second wiring layer;
    a plurality of fourth source wirings formed on the fourth wiring layer, the fourth wiring layer being located nearer the substrate than the third wiring layer;
    a first contact that connects one of the first source wirings and one of the second source wirings with each other at a part where the first source wiring and the second source wiring intersect with each other;
    a second contact that connects one of the third source wirings and at least one of the first source wirings and the second source wirings with each other; and
    a third contact that connects one of the third source wirings and one of the fourth source wirings with each other;
    at least one standard cell, wherein said fourth source wiring layer is directly coupled to at least one standard cell; and
    wherein the number of second contacts is less than the number of third contacts, and
    a plurality of signal wiring layers are included between the second wiring layer and the third wiring layer, and a plurality of signal wiring layers are included between the third wiring layer and the fourth wiring layer.

* * * * *